(12) United States Patent
Terada et al.

(10) Patent No.: US 8,168,920 B2
(45) Date of Patent: May 1, 2012

(54) BONDING DEVICE

(75) Inventors: Toru Terada, Ishikawa-ken (JP); Eiji Tanaka, Ishikawa-ken (JP); Yasuhisa Matsumoto, Ishikawa-ken (JP); Keiichi Yamaoka, Ishikawa-ken (JP)

(73) Assignee: Shibuya Kogyo Co., Ltd., Kanazawa-shi, Ishikawa-ken (JP)

( * ) Notice: Subject to any disclaimer, the term of this patent is extended or adjusted under 35 U.S.C. 154(b) by 883 days.

(21) Appl. No.: 12/207,128

(22) Filed: Sep. 9, 2008

(65) Prior Publication Data

US 2009/0071945 A1  Mar. 19, 2009

(30) Foreign Application Priority Data

Sep. 11, 2007 (JP) ................ P2007-235502
Oct. 18, 2007 (JP) ................ P2007-271725
Jan. 31, 2008 (JP) ................ P2008-020085

(51) Int. Cl.
*B23K 1/005* (2006.01)
*H01L 21/60* (2006.01)

(52) U.S. Cl. ......... 219/121.65; 219/121.76; 219/121.83; 228/180.22

(58) Field of Classification Search ............. 219/121.65, 219/121.66, 121.75, 121.84, 121.76, 121.83; 29/832, 840; 228/232
See application file for complete search history.

(56) References Cited

U.S. PATENT DOCUMENTS

| | | | | |
|---|---|---|---|---|
| 5,107,482 A * | 4/1992 | Goto et al. | ................ | 369/100 |
| 7,126,746 B2 * | 10/2006 | Sun et al. | ................ | 359/333 |
| 2007/0037318 A1 * | 2/2007 | Kim | ................ | 438/106 |
| 2008/0268571 A1 * | 10/2008 | Kim | ................ | 438/108 |

FOREIGN PATENT DOCUMENTS

| | | | |
|---|---|---|---|
| JP | 02-258185 | | 10/1990 |
| JP | 03221262 A | * | 9/1991 |
| JP | 05-335377 | | 12/1993 |

* cited by examiner

*Primary Examiner* — Samuel M Heinrich
(74) *Attorney, Agent, or Firm* — Drinker Biddle & Reath LLP

(57) ABSTRACT

A bonding device includes a bonding head including a bonding tool for sucking and holding an electronic component, and a laser heater for heating the electronic component by irradiating laser light on the electronic component held by the bonding tool from an inside of the bonding head, the laser heater including a collective unit for condensing laser light emitted from a light source. A focusing point of the laser light condensed by the collective unit is formed inside the bonding head.

7 Claims, 6 Drawing Sheets

BONDING DEVICE

This application claims priority from Japanese Patent Application No. 2007-235502 filed on Sep. 11, 2007, Japanese Application No. 2007-271725 filed on Oct. 18, 2007 and Japanese Patent Application No. 2008-20085 filed on Jan. 31, 2008, the entire subject matter of which is incorporated herein by reference.

BACKGROUND OF THE INVENTION

1. Field of the Invention

The present invention relates to a bonding device capable of bonding an electronic component by heating the electronic component by irradiating laser light from an inside of a bonding head of the bonding device.

2. Description of the Related Art Japanese Patent Number 3195970 discloses a related bonding device using a bonding method in which a transmittable bonding tool is employed and an electronic component is heated by irradiating laser light and thus the electronic component is bonded.

The related bonding device includes a laser heating device that is able to control oscillation and stop of laser light by turning ON and OFF current supply to the laser oscillator. In addition, the related bonding device is also able to control energy intensity of laser light by changing a current value.

Further, in the related bonding device, since laser light is directly irradiated onto an electronic component, the electronic component can be heated rapidly by supplying current having a predetermined value. Further, the component can be simply cooled down by stopping the laser, and thus a particular cooling unit is not necessary. Accordingly, the related bonding device can shorten a bonding time.

FIG. 8 is an explanatory diagram showing a heating theory of the related bonding device. As shown in FIG. 8, laser light 20 passes through an optical fiber 9 connected to a laser oscillator 14 as a light source. The laser light is diffused when exiting from the optical fiber. Thus, even in the method of heating a semiconductor chip 1 as an electronic component by irradiating laser light 20 thereon, the exited laser light 20 is condensed by passing through a condensing lens 11 disposed in an optical path, and the irradiation area is made to coincide with a size of the semiconductor chip 1 in order to use energy for the heat generation effectively.

In the related bonding device, the laser light 20 may be oscillated in a state where a bonding tool does not suck and hold the electronic component at the time of assembly adjustment and the like. In this case, since a focusing point 12 (a point at which a laser diameter is minimized) of the laser light 20 has an extremely powerful energy, a placing stage or a substrate may be damaged and destructed if the focusing point is located on or near the placing stage or the substrate.

Further, in a manufacturing process using the related bonding device, silicon that is frequently used for the semiconductor chip 1 can absorb infrared light as the laser light 20. However, optical absorptance of the silicon is about 60% to 70%, and the rest of the laser light 20 is transmitted through the semiconductor chip 1. Thus, even though a power of the laser light decreases when the laser light is transmitted through the semiconductor chip 1, the laser light 20 is irradiated onto a substrate and the like. In this case, at the focusing point 12, the laser light may still have energy enough to damage or heat the substrate and the like. Moreover, when a bonding process is performed in a state where the substrate is heated and expanded, positions of a bump and an electrode are deviated from each other, and thus the bonded product may become defective.

In the related bonding device, irradiation of the laser light is controlled depending on only a preset current value i and a preset time t as shown in FIG. 9. Thus, since the laser oscillator should be turned ON and OFF repeatedly, there has been a problem of durability of the laser oscillator. Further, some electronic components are not allowed to be rapidly cooled down. For example, if the electronic components are rapidly cooled down, solder is deformed as spots or internal stress occurs therein when the solder solidifies. Hence, stability and position precision of the bonding process deteriorates.

As a heating unit of the bonding device, there has been proposed a heating method (Joule heating system) in which laser light is irradiated onto a bonding tool being absorptively holding an electronic component and the electronic component is heated by the bonding tool. In this heating method, rear temperature is detected by using a thermocouple formed on the bonding tool for holding the electronic component. Therefore, a current value can be feedback-controlled in accordance with a preset temperature profile.

However, in the method of irradiating laser light onto the electronic component, the electronic component is heated by irradiating the laser light directly on the electronic component. Thus, even when temperature of the bonding tool is set, control is independent of the setting. In addition, since temperature of the electronic component can not be directly measured, a current value can not be feedback-controlled. Consequently, the heating method of heating the electronic component by directly irradiating laser light on the electronic component is not suitable for some electronic components which are difficult to be rapidly cooled down.

In addition, the related bonding device disclosed in Japanese Patent Number 3195970 is configured to guide laser light through an optical fiber. However, the optical fiber may be damaged, broken and cut. In such a state, it is difficult to perform a bonding process by appropriately heating an electronic component. In addition, the laser light may leak outside.

JP-A-02-258185 discloses a unit of detecting abnormality of the fiber before the bonding process. Incidentally, in a method of detecting the abnormality of the fiber at the time of bonding (or cutting), detection is performed after the electronic component and the substrate are heated and pressed. However, since a bump and a bonding agent (resin and the like) are deformed after the electronic component and the substrate are heated and pressed, it is difficult to use them again. Therefore, the method of detecting the abnormality of the fiber at the time of bonding (or cutting) is not useful.

The inspection unit disclosed in JP-A-02-258185 is an inspection unit of a laser device used in a laser cutting (used in a cutting process of industrial products or medical treatment). In the inspection unit, inspection light is separately generated from a light source for inspection, independent of a laser cutting, and fiber abnormality is inspected by detecting inspection light exiting from the other end of an optical fiber for the laser cutting.

However, the inspection unit should have an individual light source other than a main light source for a cutting process. Thus, a size of the inspection unit becomes large and complicated.

SUMMARY OF THE INVENTION

One aspect of the invention provides a bonding device configured to prevent a stage or a substrate from damage and heat expansion by setting a focusing point of laser light, which is condensed by a collective unit, inside a bonding head, even when laser light is oscillated in a state where a bonding tool does not suck and hold an electronic component or laser light transmitted through the electronic component is irradiated onto the stage or the substrate.

Another aspect of the invention provides a bonding device that is able to control current to increase or decrease appropriately to an electronic component to be bonded and enables an increase in lifetime of a laser oscillator together with improvement in stability and position precision of a bonding process. In the bonding device, the laser heater has a profile setting unit for setting a current profile of the current applied to the laser oscillation unit at the time of bonding and a control unit for controlling a current value of the current applied to the laser oscillation unit in accordance with the set current profile.

Still another aspect of the invention provides a bonding device capable of detecting fiber abnormality without any adverse effect on an electronic component or a bonding target before a bonding process, by performing inspection using laser light exiting from the fiber with a lower laser power than a power at the time of bonding. In the bonding device, a control unit for controlling a power of the laser light exiting from the laser oscillation unit to be variable is employed.

According to a first aspect of the invention, there is provided a bonding device comprising: a bonding head comprising a bonding tool for sucking and holding an electronic component; and a laser heater for heating the electronic component by irradiating laser light on the electronic component held by the bonding tool from an inside of the bonding head, the laser heater comprising a collective unit for condensing laser light emitted from a light source, wherein a focusing point of the laser light condensed by the collective unit is formed inside the bonding head.

According to a second aspect of the invention, the laser heater comprises: a laser oscillation unit for oscillating laser light by applying current; a profile setting unit for setting a current profile of the current applied to the laser oscillation unit when executing bonding; and a control unit for controlling a current value of the current applied to the laser oscillation unit in accordance with the set current profile.

According to a third aspect of the invention, the profile setting unit sets the current profile on the basis of a temperature profile.

According to a fourth aspect of the invention, wherein the laser heater comprises: a laser oscillation unit for oscillating laser light; a fiber for guiding the laser light from the laser oscillation unit into the bonding head; a bonding stage for supporting a bonding target of the electronic component; a control unit for controlling a power of the laser light exiting from the laser heater to be variable, a light receiving unit for receiving the laser light exiting from the fiber; a moving tool for moving the bonding head relative to the bonding stage; and an inspection unit for inspecting light guiding quality of the fiber on the basis of a light receiving amount of the light receiving unit, wherein a light receiving portion of the light receiving unit is disposed inside the bonding head, wherein the laser light exits from the fiber with a laser power that is lower than a laser power at the time of bonding in a state where the electronic component is held onto the lower side of the bonding head, and wherein the inspection unit inspects light guiding quality of the fiber on the basis of a light receiving amount including an amount of reflection light reflected from the electronic component and received by the light receiving unit.

According to a fifth aspect of the invention, the fiber comprises a plurality of fibers, and the laser light exits a plurality of times sequentially from fiber groups, each of which has a predetermined number of fibers, by being guided separately through the fiber groups, and the inspection unit inspects the light guiding quality of the fiber.

According to a sixth aspect of the invention, wherein the laser heater comprises: a laser oscillation unit for oscillating laser light; a fiber for guiding the laser light from the laser oscillation unit into the bonding head; a bonding stage for supporting a bonding target of the electronic component; a control unit for controlling a power of the laser light exiting from the laser heater to be variable; a light receiving unit for receiving the laser light exiting from the fiber; a moving tool for moving the bonding head relative to the bonding stage; and an inspection unit for inspecting light guiding quality of the fiber on the basis of a light receiving amount of the light receiving unit, wherein a light receiving portion of the light receiving unit is disposed facing upward to be movable relative to the bonding head, wherein the laser light exits from the fiber with a laser power that is lower than a laser power at the time of bonding in a state where the electronic component is not held onto the lower side of the bonding head and the light receiving portion of the light receiving unit is disposed below the bonding head, and wherein the inspection unit inspects light guiding quality of the fiber on the basis of a light receiving amount of the light receiving unit.

According to a seventh aspect of the invention, the fiber comprises a plurality of fibers, and the laser light exits a plurality of times sequentially from fiber groups, each of which has a predetermined number of fibers, by being guided separately through the fiber groups, and the inspection unit inspects the light guiding quality of the fiber.

According to the first aspect of the invention, a focusing point by a collective unit is formed inside a bonding head. Thus, it is possible to achieve a bonding device capable of preventing a placing stage or a substrate from damage and heat expansion, even when laser light is oscillated at the time of assembly adjustment or laser light is transmitted through a semiconductor chip.

According to the second aspect of the invention, the laser heater has a profile setting unit for setting a current profile of the current applied to the laser oscillation unit at the time of bonding and a control unit for controlling a current value of the current applied to the laser oscillation unit in accordance with the set current profile. Thus, it is possible to control current to increase or decrease and achieve an increase in lifetime of a laser oscillator together with improvement in stability and position precision of a bonding process.

According to the fourth aspect of the invention, the laser light exits from the fiber with a laser power lower than a laser power at the time of bonding in a state where an electronic component is held onto the lower side of the bonding head, and the inspection unit inspects light guiding quality of the fiber on the basis of a light receiving amount including an amount of reflection light reflected from the electronic component and received by the light receiving unit. Thus, by using laser light for inspection, it is possible to detect fiber abnormality before a bonding process of the electronic component without any adverse effect on the electronic component or a bonding target and without an individual light source for inspection.

According to the sixth aspect of the invention, a light receiving portion of the light receiving unit is disposed facing upward to be movable relative to the bonding head. According thereto, the laser light exits from the fiber with a laser power lower than a laser power at the time of bonding in a state where the electronic component is not held onto the lower side of the bonding head and the light receiving portion of the light receiving unit is disposed below the bonding head. Then, the inspection unit inspects light guiding quality of the fiber on the basis of a light receiving amount of the light receiving unit. Thus, it is possible to inspect light guiding quality of the fiber before the bonding process of the electronic component without laser irradiation onto the electronic component or a bonding target and without adverse effect on a light receiving element constituting a light receiving portion and the vicinity thereof since the laser light has a low power.

BRIEF DESCRIPTION OF THE DRAWINGS

FIG. 2A shows the bonding head at the time of inspection and FIG. 2B shows the bonding head at the time of bonding;

FIG. 3A shows the bonding device at the time of inspection and FIG. 3B shows the bonding device at the time of bonding;

FIG. 4A shows the bonding device at the time of inspection and FIG. 4B shows the bonding device at the time of bonding;

FIG. 8 is sectional explanatory diagram showing a heating theory of a known bonding device.

DETAILED DESCRIPTION OF THE PREFERRED EMBODIMENTS

Figure 1:
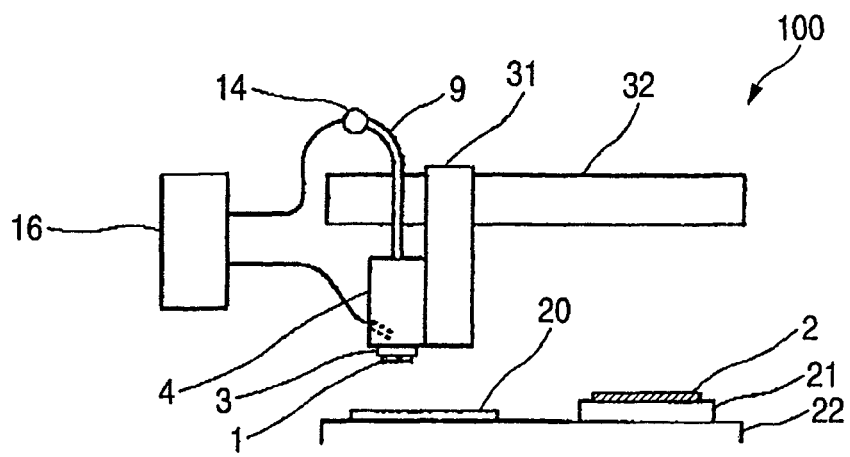
FIG. 1 is a schematic diagram showing an entire system of a bonding device in a case where a light receiving unit is disposed in a bonding head.

Hereinafter, embodiments of the invention will be described together with referring to the drawings. In the embodiments, a bonding device 100 is a device for bonding a semiconductor chip 1 which is an electronic component to a substrate 2 serving as a bonding target.

First Embodiment

FIG. 1 is a schematic diagram showing an entire system of the bonding device 100 according to a first embodiment. The bonding device 100 has a bonding head 4 for bonding the semiconductor chip 1 to the substrate 2 and a table 22 on which a chip tray 20 and a substrate placing stage 21 is disposed. Further, since the chip tray 20 is used for chip supply, the chip tray is not limited to this tray form, and may be a wafer itself. In addition, the substrate placing stage 21 constitutes a bonding stage for performing a bonding process.

The bonding head 4 has a bonding tool 3 which is formed on a leading end portion (lower end portion) of the head to suck and hold the semiconductor chip 1. The bonding head 4 is configured to be movable by a lifting tool 31 and a horizontal moving tool 32. Specifically, the bonding head 4 repeats operations of sucking and holding the semiconductor chip 1 by using the bonding tool 3 in the chip tray 20 serving as a chip supply unit, moving to the substrate placing stage 21 which is a bonding position, moving down and loading the semiconductor chip 1 on the substrate 2, heating and bonding the chip, completing the bonding process by cooling down and fixing the chip, and returning to a chip supply position by moving up.

In the first embodiment, the lifting tool 31 and the horizontal moving tool 32 is disposed on the bonding head 4 in order to make the bonding head 4 movable. However, the bonding head 4 and the chip tray 20 or the substrate placing stage 21 can be simply configured to relatively move from each other. Thus, by providing a drive tool on a table 22 on which the chip tray 20 and the substrate placing stage 21 are disposed and moving the table 22, the chip tray 20 and the substrate placing stage 21 may be relatively moved from the bonding head 4. Alternatively, by moving both of the table 22 and the bonding head 4, both of them may be relatively moved from each other.

The inside of the bonding head 4 is a cavity 5. In the cavity 5, there is provided a laser heating device 6 for heating the semiconductor chip 1 held by the bonding tool 3 by irradiating laser 17 from the inside of the bonding head 4.

The bonding tool 3 is mounted on the lower end portion of the bonding head 4. The bonding tool 3 has low thermal expansion and employs quartz glass having good characteristics in transmissivity of the laser 17. In addition, any material through which the laser 17 is transmittable such as sapphire may be employed. An adsorption hole 18 for holding the semiconductor chip 1 in vacuum is formed in a central portion of the bonding tool 3. Antireflective layer is formed on the surface (the upper surface in FIGS. 2A and 2B) located inside the bonding head 4 of the bonding tool 3.

A suction passage 7 is formed in the bonding head 4. The cavity 5 is airtightly sealed other than the suction passage 7 and the adsorption hole 18 of the bonding tool 3 mounted on the lower end of the bonding tool 4. The suction passage 7 is connected to a suction device 8. Accordingly, negative pressure is applied to the cavity 5 inside the bonding head 4 by suctioning air with the suction device 8. Thus, it is possible to attach the semiconductor chip 1 to the adsorption hole 18 of the bonding tool 3.

A laser heating device 6 includes a laser oscillator 14, a control unit 16, an optical fiber 9, a condensing lens 11 and a shielding plate 15. The laser oscillator 14 serves as a light source. The control unit 16 determines a current profile of current applied to the laser oscillator 14 and controls a current value of the current applied to the laser oscillator 14 depending on the current profile so as to change a power of the laser 17 exiting from the laser oscillator 14. The optical fiber 9 is connected to the laser oscillator 14 and guides the laser 17. The optical fiber 9 includes a laser exit port 10 that is located in the bonding head 4 so that the laser 17 exits from the lower portion of the optical fiber 9. The condensing lens 11 serves as a collective unit for condensing laser 17 exiting from the exit port 10. The shielding plate 15 restricts a irradiation area of the laser 17.

Further, the laser 17 exiting from the optical fiber 9 is diffused and incident on the condensing lens 11. Thus, a focusing point of the laser 17 is located lower than a focal point of the condensing lens 11.

The condensing lens 11 employs one convex lens. Alternatively, a plurality of lenses may be employed. The condensing lens 11 is supported by a holder in the bonding head 4. The focusing point A of laser condensed by the condensing lens 11 is set in the cavity 5 which is the inside of the bonding head 4. Further, the front and back surfaces of the condensing lens 11 has an antireflective layer formed thereon. In addition, a concave mirror may be employed as the collective unit.

The shielding plate 15 is configured to prevent leakage of the laser 17 transmitted through the condensing lens 11 from the semiconductor chip 1 to be irradiated. Incidentally, the shielding plate 15 may not be employed when the irradiation area is adjustable to be restricted within the semiconductor chip 1 only by the condensing lens 11.

The laser 17 is irradiated onto the substrate 2 when leaking out from the semiconductor chip 1. Thus, there is a risk of thermal expansion of the substrate 2 heated by the irradiation. When the substrate 2 is made of resin, the substrate greatly expands as compared with the substrate 2 made of silicon. When the thermally expanded substrate 2 is subjected to a bonding process, positions of a bump and an electrode are deviated from each other, and the semiconductor chip 1 is occasionally deformed even when the substrate is cooled down and recovered, whereby the semiconductor chip 1 may become defective. The shielding plate 15 is provided to avoid the risk of thermal expansion of the substrate 2.

A photo sensor 12 is formed diagonally above the bonding tool 3 in the bonding head 4. The photo sensor 12 detects scattered light such as reflection light of the laser 17 irradiated onto and reflected from the semiconductor chip 1 that is sucked and attached to the bonding tool 3. In the first embodiment, the photo sensor 12 serves as a light receiving unit. The light receiving portion 13 of the photo sensor 12 is installed in the lower side in the bonding head 4, that is, installed toward the semiconductor chip 1 fixed in the lower side in order to receive light reflected from the surface of the semiconductor chip 1. A signal generated from the light receiving portion 13 of the photo sensor 12 is input to the control unit 16 through the fiber. Further, the photo sensor 12 may be formed in the control unit 16 to receive light guided by the optical fiber toward the inside of the bonding head 4. In this case, the leading end of the optical fiber toward the inside of the bonding head 4 serves as the light receiving portion 13.

The control unit 16 includes a CPU 23, a current circuit 24 including a voltage limiter and a power supply, an illuminance detection circuit 25 connected to the photo sensor 12, and a temperature detection circuit 26 connected to a thermocouple 27 attached to a test chip 28.

A current profile is set by the control unit 16 in accordance with the following procedure.

As setting preparation, the test chip 28 including the thermocouple 27 is attached to the chip position at the time of bonding.

Second, a setting screen of a temperature profile is displayed on a monitor screen of the control unit 16, and the temperature profile at the time of production is input thereto.

Third, a current profile based on an input temperature profile is calculated by the control unit 16.

Detailed calculation method of the current profile is performed as follows.

Figure 7:
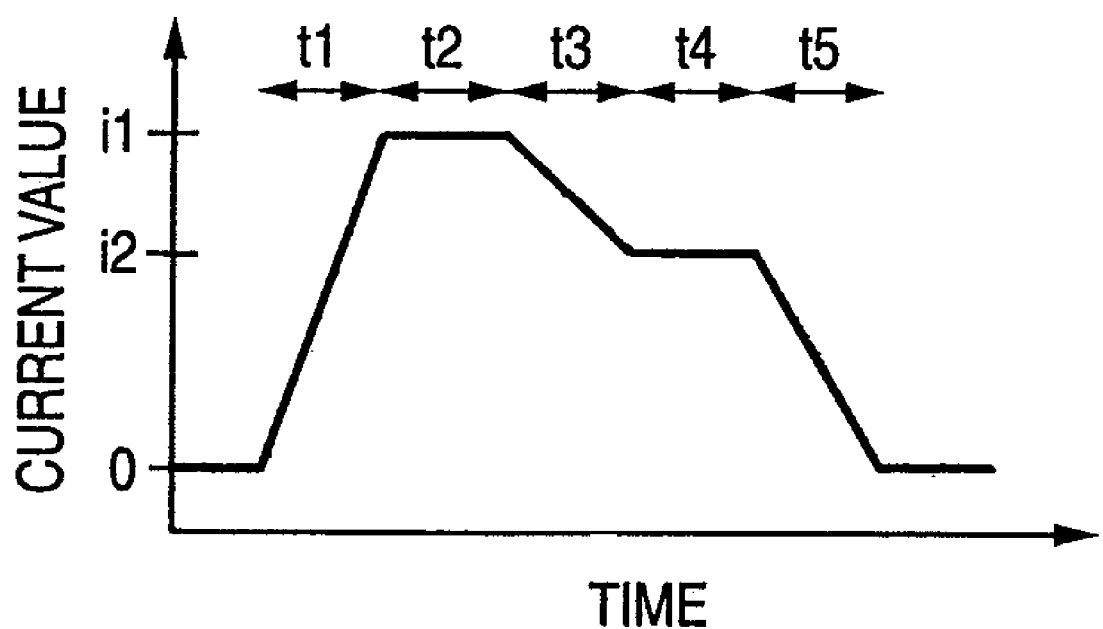
FIG. 7 is a graph of current control based on a current profile.
Figure 9:
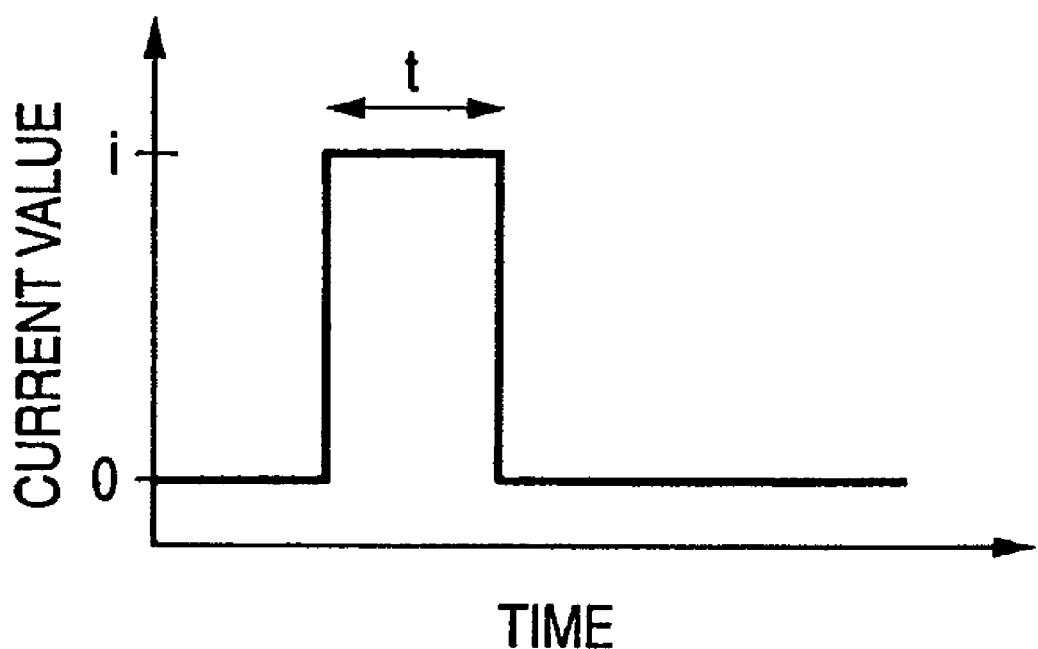
FIG. 9 is a graph of current control in the past.

First, a current that is assumed based on the input temperature profile is applied, and the test chip 28 including the thermocouple 27 is practically heated by the laser 17. The applied current value is calculated through a process of trial and error so that a practical rising time when a temperature of the test chip 28 increases to the set temperature of the input temperature profile becomes equal to a set rising time. Thereby, the calculated current value is stored. That is, as shown in FIG. 7, a set current value i1, an rising time t1 to the set current value i1, an irradiation time t2 at the set current value i1, a set current value i2, a variation time t3 to the set current value i2, an irradiation time t4 at the set current value i2 and a falling time t5 are calculated.

In the above-described method, the current profile is obtained from the temperature profile. Alternatively, the current profile may be directly set by a user.

Further, the current profile can also be obtained as follows.

First, as setting preparation, the test chip 28 including the thermocouple 27 is attached to the chip position.

Second, data as to relation between a current value and temperature and relation between a rising time and a falling time are accumulated as large as possible.

Third, a setting screen of a temperature profile is displayed on a monitor screen, and the temperature profile at the time of production is input.

Fourth, an appropriate current profile is obtained from the data in which a current profile based on the temperature profile is stored.

Figures 2A, 2B:
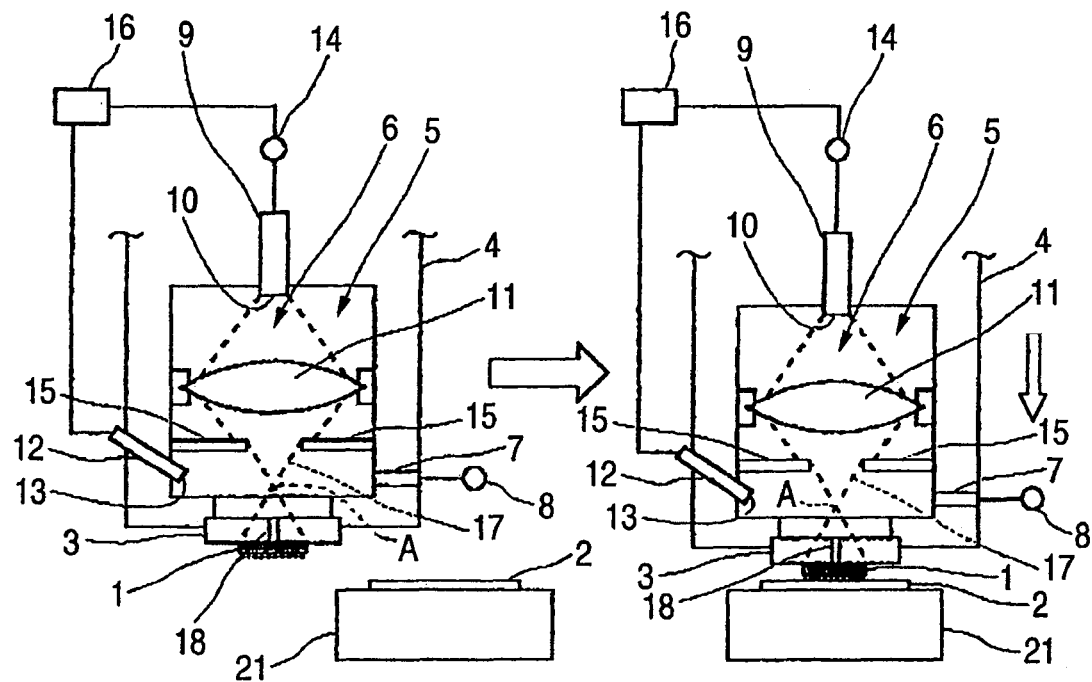
FIGS. 2A and 2B are explanatory diagrams showing the inside of the bonding head, where

At the time of production, the control unit 16 controls current on the basis of the stored current profile, and applies current to the laser oscillator 14 through the constant current circuit 24 including a voltage limiter and a power supply. Thereby, the laser oscillator 14 oscillates the laser 17. In the first embodiment, the laser oscillator 14 is separately provided independent of the bonding head 4, and laser light is guided into the bonding head 4 through the optical fiber 9. Alternatively, the laser oscillator 14 may be integrally formed in the bonding head 4. The laser exit port 10 of the optical fiber 9 is installed downward to face the bonding tool 3 as shown in FIGS. 2A and 2B. A direction of the port can be set without restriction by using a reflective mirror and the like.

Further, the control unit 16 inspects whether a light receiving amount of the light receiving portion 13 is not less than a predetermined amount as compared with a preset reference. If a light receiving amount satisfies the predetermined amount, the control unit 16 commands the bonding head 4 to move to a position above the substrate 2 and move downward and bond the semiconductor chip 1 being held to the substrate 2. If a light receiving amount does not satisfy the predetermined amount, the control unit 16 commands the bonding head 4 to stop and generates an alert of fiber abnormality.

Inspection is performed in order to detect the situation in which the optical fiber 9 is broken by repeated friction. Here, the friction is caused by reciprocating movement of the bonding head 4 between the chip supply position and the bonding position.

Hereinafter, bonding operations will be described. First, at the bonding position, the substrate 2 is placed on the substrate placing stage 21. On the other hand, at the chip supply position, the bonding head 4 sucks and holds the semiconductor chip 1 in the chip tray 20 with the bonding tool 3, and moves upward. Subsequently, the bonding head 4 is moved by a horizontal moving tool 32 to the substrate placing stage 21 which is the bonding position.

In the process of the movement, the laser oscillator 14 is operated for the inspection, and the laser 17 exits from the laser exit port 10 of the optical fiber 9 with a laser power lower than a power at the time of bonding. At this time, the light receiving portion of the photo sensor 12 receives scattered light including light reflected from the upper surface of the semiconductor chip 1. Accordingly, it is possible to inspect whether a light receiving amount is not less than the predetermined amount. When a light receiving amount satisfies the predetermined amount, the bonding head 4 moves to a position above the substrate 2 and moves downward and bonds the semiconductor chip 1 being held to the substrate 2. When a light receiving amount does not satisfy the predetermined amount, the bonding head 4 stops and an alert of fiber abnormality is output. Incidentally, in the bonding process, the held semiconductor chip 1 may be heated by irradiating the laser in a state where the chip is pressed onto the substrate 2. Alternatively, the held semiconductor chip 1 may be heated by irradiating the laser in a state where the semiconductor chip 1 is just placed on the substrate 2 without pressure.

Second Embodiment

Figure 3A:
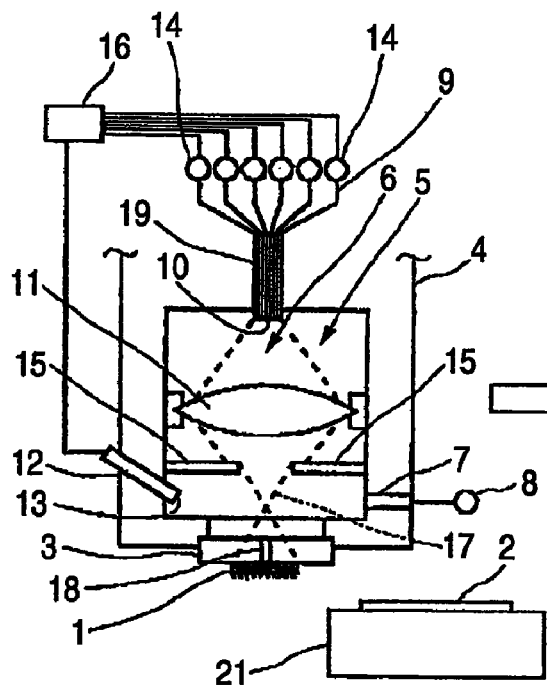
FIGS. 3A and 3B are explanatory diagrams showing a bonding device of a second embodiment in a case where inspection is performed on each optical fiber, where
Figure 3B:
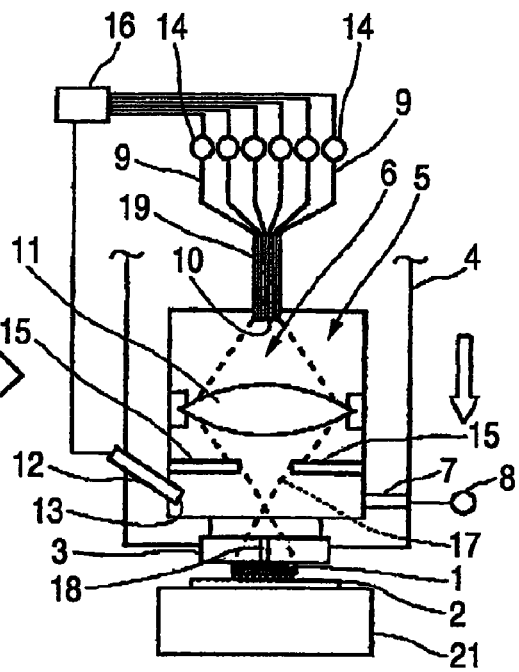

In the first embodiment, the optical fiber 9 which is a single fiber connected to the single laser oscillator 14 is employed, and the laser 17 exits from the single laser exit port 10. Alternatively, there is proposed a second embodiment as shown in FIGS. 3A and 3B. In the second embodiment, a fiber bundle 19 is formed of a plurality of thin optical fibers 9 that are connected to a plurality of laser oscillators 14. Herein, each of the laser oscillators 14 is individually controllable. Thus, in the second embodiment, plural beams of the laser 17 exit from a plurality of laser exit ports 10, respectively.

When the plural beams of laser 17 exit from the plurality of laser exit ports 10 of the fiber bundle 19, it is hard to specify which one of the optical fibers 9 is abnormal though fiber abnormality is detected by the detection unit according to the first embodiment. Accordingly, as shown in FIGS. 3A and 3B, when the plural beams of laser 17 exit from the plurality of laser exit ports 10 of the fiber bundle 19, one laser oscillator 14 is operated, and the laser beam 17 exits from the laser exit port 10 of one optical fiber 9 connected to the laser oscillator 14. Subsequently, the laser beams are guided one by one, and inspections as to whether a light receiving amount of light received in the light receiving portion 13 is not less than the predetermined amount are sequentially performed a plurality of times. Therefore, it is possible to inspect which one of the optical fibers 9 in the fiber bundle 19 is abnormal.

Incidentally, the laser beams 17 may exit one by one with a low laser power. Alternatively, each power of optical fibers 9 to be inspected may be equal to the power at the time of bonding. Since the laser beam 17 exits only from the laser exit port of one optical fiber 9 in the fiber bundle 19, a laser power of one fiber is lower than a total laser power at the time of bonding using the entire fiber bundle 19. Therefore, it is not necessary that each power of the optical fibers 9 to be inspected is set lower than the power at the time of bonding.

Third Embodiment

Figure 4A:
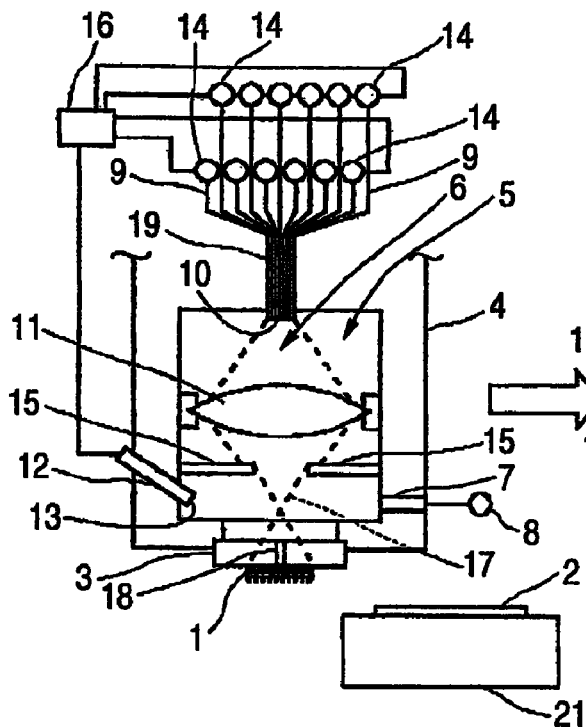
FIGS. 4A and 4B are explanatory diagrams showing a bonding device of a third embodiment in a case where inspection is performed on each optical fiber group, where
Figure 4B:
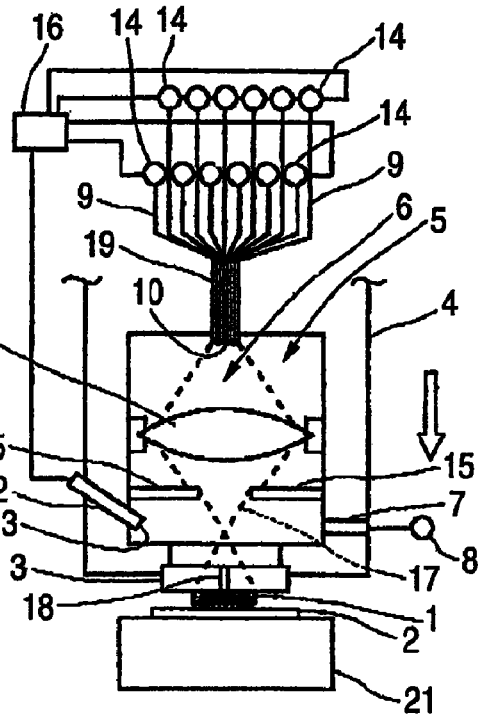

There is proposed a third embodiment as shown in FIGS. 4A and 4B. In the third embodiment, a fiber bundle 19 formed of a plurality of thin optical fibers 9 connected to a plurality of laser oscillators 14 set as groups each of which is individually controllable is employed, and plural beams of the laser 17 exit from a plurality of laser exit ports 10, respectively.

When the plural beams of laser 17 exit from the plurality of laser exit ports 10 of the fiber bundle 19, it is hard to specify which one of the optical fibers 9 is abnormal though fiber abnormality is detected by the detection unit according to the first embodiment.

Accordingly, as shown in FIGS. 4A and 4B, when the plural beams of laser 17 exit from the plurality of laser exit ports 10 of the fiber bundle 19, laser oscillators 14 belonging to one group are operated, and the laser beams 17 exit from the laser exit ports 10 of optical fibers 9 connected to the laser oscillators 14 of the group. Subsequently, the laser beams are separately guided through each fiber group, and inspections as to whether a light receiving amount of light received in the light receiving portion 13 is not less than the predetermined amount are sequentially performed a plurality of times. Therefore, it is possible to inspect which group of the optical fibers 9 in the fiber bundle 19 is abnormal.

Even in this case, the laser beams 17 may be made to separately exit through each fiber group with a low laser power. Alternatively, each power of optical fiber groups 9 to be inspected may be equal to the power at the time of bonding. Since the laser beams 17 exit only from the laser exit ports 10 of one optical fiber group 9 in the fiber bundle 19, a laser power of one group is lower than a total laser power at the time of bonding using the entire fiber bundle 19. Therefore, it is not necessary that each power of the optical fiber groups 9 to be inspected is set lower than the power at the time of bonding. Further, in the third embodiment, the laser oscillators 14 may be configured to be separately operated in each fiber group 9 by providing switch circuits to laser oscillators 14, respectively. Accordingly, inspection may be performed on fibers one by one in each fiber group 9 similarly to the second embodiment.

Fourth Embodiment

Figure 5:
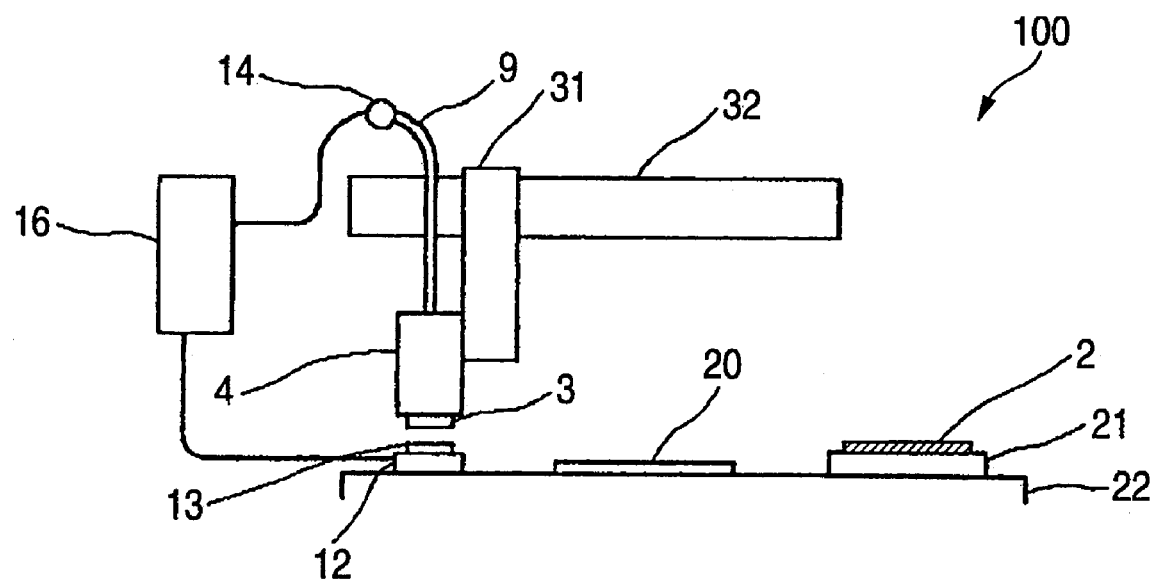
FIG. 5 is an explanatory diagram showing an entire system of a fourth embodiment in a case where a light receiving unit is disposed outside a bonding head.
Figure 6:
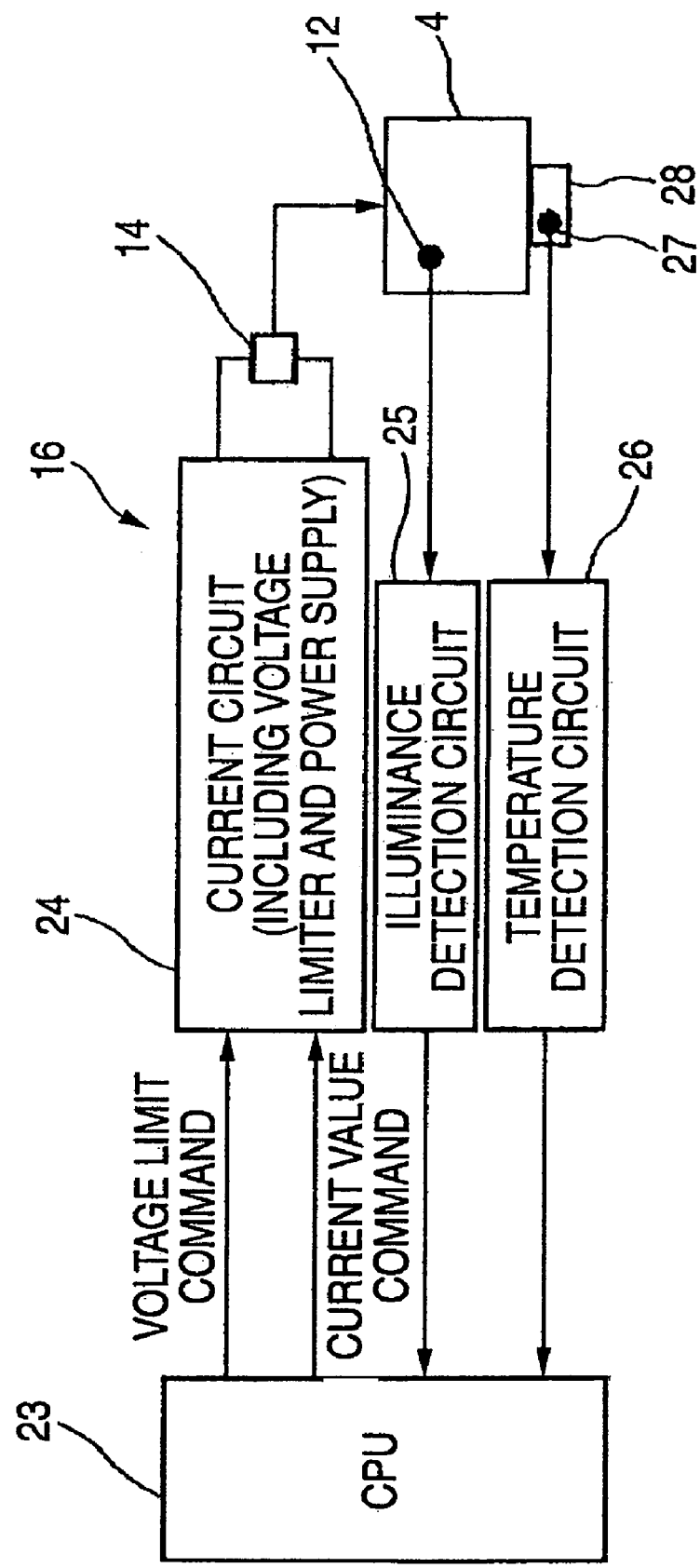
FIG. 6 is a block diagram showing relation between a control unit and a bonding head.

There is proposed a fourth embodiment as shown in FIG. 5. In the first to third embodiments, the light receiving portion 13 of the photo sensor 12 serving as the light receiving unit is disposed downward in the bonding head 4. Alternatively, the light receiving portion 13 of the photo sensor 12 serving as the light receiving unit may be installed upward on the table 22 outside the bonding head 4 as shown in FIG. 5. In the fourth embodiment, it is possible to observe the lower end of the bonding head 4 by using the external light receiving portion 13.

In the fourth embodiment, operations are performed as follows.

First, when the bonding device is started before start of manufacturing processes, or when the bonding head 4 does not yet reach the chip tray 20 after bonding the semiconductor chip 1 to the substrate 2 and moving upward (i.e., in a state where the bonding head 4 is not holding the semiconductor chip 1), the bonding head 4 is horizontally moved such that the bonding head 4 is located above the light receiving portion 13.

At the position where the bonding head 4 is located above the light receiving portion 13, the laser light 17 is irradiated with a laser power lower than the power at the time of bonding. At this time, it is inspected whether a light receiving amount of light incident from the light receiving portion 13 is not less than the predetermined amount. From the result of inspection, when the predetermined amount is satisfied, a bonding operation is performed on the semiconductor chip 1 being held. Otherwise, when the predetermined amount is not satisfied, the bonding operation is stopped, and an alert about abnormality of the optical fiber 9 is output.

Further, in this embodiment, the bonding head 4 is moved. Alternatively, the bonding head 4 and the light receiving portion 13 can be simply configured to relatively move from each other. Thus, the table 22 on which the light receiving portion 13 is installed may be moved, both of the bonding head 4 and the light receiving portion 13 may be moved, or only the light receiving portion 13 may be moved.

Fifth Embodiment

Further, the laser 17 may exit from a plurality of laser exit ports 10 while the light receiving portion 13 is disposed outside the bonding head 4.

A fifth embodiment is proposed as one example of the configuration just mentioned above. In the fifth embodiment, a fiber bundle 19 is formed of a plurality of thin optical fibers 9 connected to a plurality of laser oscillators 14. Each of the laser oscillators 14 is individually controllable. Plural beams of the laser 17 exit from a plurality of laser exit ports 10, respectively. The laser exit port 10 is the same as the laser exit port 10 shown in FIGS. 3A and 3B.

Sixth Embodiment

In addition to the fifth embodiment, a sixth embodiment is proposed. In the sixth embodiment, a fiber bundle 19 is formed of a plurality of thin optical fibers 9 connected to a plurality of laser oscillators 14. The plurality of laser oscillators 14, each of which is individually controllable, is set as groups. Plural beams of the laser 17 exit from a plurality of laser exit ports 10, respectively. The laser exit port 10 is the same as the laser exit port 10 shown in FIGS. 4A and 4B.

In this case, an inspection method and a power level is similar to the second and third embodiments.

What is claimed is:

1. A bonding device comprising:
   a bonding head comprising a bonding tool for sucking and holding an electronic component; and
   a laser heater for heating the electronic component by irradiating laser light on the electronic component held by the bonding tool from an inside of the bonding head, the laser heater comprising a collective unit for condensing laser light emitted from a light source,
   wherein a focusing point of the laser light condensed by the collective unit is formed inside the bonding head.

2. The bonding device according to claim 1, wherein the laser heater comprises:
   a laser oscillation unit for oscillating laser light by applying current;
   a profile setting unit for setting a current profile of the current applied to the laser oscillation unit when executing bonding; and
   a control unit for controlling a current value of the current applied to the laser oscillation unit in accordance with the set current profile.

3. The bonding device according to claim 2, wherein the profile setting unit sets the current profile on the basis of a temperature profile.

4. The bonding device according to claim 1,
   wherein the laser heater comprises:
      a laser oscillation unit for oscillating laser light;
      a fiber for guiding the laser light from the laser oscillation unit into the bonding head;
      a bonding stage for supporting a bonding target of the electronic component;
      a control unit for controlling a power of the laser light exiting from the laser heater to be variable;
      a light receiving unit for receiving the laser light exiting from the fiber;
      a moving tool for moving the bonding head relative to the bonding stage; and
      an inspection unit for inspecting light guiding quality of the fiber on the basis of a light receiving amount of the light receiving unit,
   wherein a light receiving portion of the light receiving unit is disposed inside the bonding head,
   wherein the laser light exits from the fiber with a laser power that is lower than a laser power at the time of bonding in a state where the electronic component is held onto the lower side of the bonding head, and
   wherein the inspection unit inspects light guiding quality of the fiber on the basis of a light receiving amount including an amount of reflection light reflected from the electronic component and received by the light receiving unit.

5. The bonding device according to claim 4,
   wherein the fiber comprises a plurality of fibers, and
   wherein the laser light exits a plurality of times sequentially from fiber groups, each of which has a predetermined number of fibers, by being guided separately through the fiber groups, and the inspection unit inspects the light guiding quality of the fiber.

6. The bonding device according to claim 1,
   wherein the laser heater comprises:
      a laser oscillation unit for oscillating laser light;
      a fiber for guiding the laser light from the laser oscillation unit into the bonding head;
      a bonding stage for supporting a bonding target of the electronic component;
      a control unit for controlling a power of the laser light exiting from the laser heater to be variable;
      a light receiving unit for receiving the laser light exiting from the fiber;
      a moving tool for moving the bonding head relative to the bonding stage; and
      an inspection unit for inspecting light guiding quality of the fiber on the basis of a light receiving amount of the light receiving unit, and
   wherein a light receiving portion of the light receiving unit is disposed facing upward to be movable relative to the bonding head,
   wherein the laser light exits from the fiber with a laser power that is lower than a laser power at the time of bonding in a state where the electronic component is not held onto the lower side of the bonding head and the light receiving portion of the light receiving unit is disposed below the bonding head, and
   wherein the inspection unit inspects light guiding quality of the fiber on the basis of a light receiving amount of the light receiving unit.

7. The bonding device according to claim 6,
   wherein the fiber comprises a plurality of fibers, and
   wherein the laser light exits a plurality of times sequentially from fiber groups, each of which has a predetermined number of fibers, by being guided separately through the fiber groups, and the inspection unit inspects the light guiding quality of the fiber.

* * * * *